United States Patent [19]

Thevenaz

[11] Patent Number: 4,620,757

[45] Date of Patent: Nov. 4, 1986

[54] CONNECTOR SOCKET

[75] Inventor: Armand Thevenaz, Auliens, Switzerland

[73] Assignee: Brintec Systems Corporation, Chicago, Ill.

[21] Appl. No.: 686,461

[22] Filed: Dec. 26, 1984

[51] Int. Cl.[4] .............................................. H05K 1/00

[52] U.S. Cl. ............................... 339/17 C; 339/176 M; 339/258 A; 339/221 M

[58] Field of Search .............. 339/17 C, 17 LC, 17 R, 339/255 R, 256 R, 258 R, 220 R, 220 M, 221 R, 221 M, 17 CF, 126 J

[56] References Cited

U.S. PATENT DOCUMENTS

| | | | |
|---|---|---|---|
| 2,907,976 | 10/1959 | Damon | 339/126 J |
| 3,383,648 | 5/1968 | Gems | 339/17 LC |
| 3,634,879 | 1/1972 | Longenecker | 339/221 M |
| 3,957,337 | 5/1976 | Damiano | 339/221 R |
| 4,166,667 | 9/1979 | Griffin | 339/221 R |
| 4,186,990 | 2/1980 | Bertoglio | 339/258 R |
| 4,196,957 | 4/1980 | Benasutti | 339/17 LC |
| 4,217,024 | 8/1980 | Aldridge et al. | 339/17 CF |
| 4,274,700 | 6/1981 | Keglevitsch et al. | 339/221 M |
| 4,381,134 | 4/1983 | Anselmo et al. | 339/221 R |

FOREIGN PATENT DOCUMENTS

| | | | |
|---|---|---|---|
| 2703010 | 7/1978 | Fed. Rep. of Germany | 339/65 |

*Primary Examiner*—Gil Weidenfeld
*Assistant Examiner*—David L. Pirlot
*Attorney, Agent, or Firm*—Hill, Van Santen, Steadman & Simpson

[57] ABSTRACT

There is disclosed herein a dual-in-line socket assembly which includes an insulator block having a plurality of socket-receiving apertures therein, each aperture adapted to receive an electrical socket. Each aperture has at one end a conically-shaped pin-receiving lead-in taper which opens into a cylindrical socket-receiving portion. An internal abutment shoulder is defined within the aperture at the junction af the lead-in taper and the socket-receiving portion. Electrical connector sockets are adapted to fit within the socket-receiving portion for receiving and electrically contacting a pin from an electrical device such as an integrated circuit chip.

1 Claim, 5 Drawing Figures

CONNECTOR SOCKET

BACKGROUND OF THE INVENTION

This invention relates to an improved electrical terminating system.

Electrical components, such as integrated circuits, are made up of dual-in-line packages, each having a plurality of pins extending therefrom. Such components have gained wide acceptance in the electronics industry. These dual-in-line packages are normally mounted on a circuit board for making connection to various other components. One system utilized in mounting dual-in-line packages to circuit boards is through the use of dual-in-line connector assemblies which include an insulator block having a plurality of pin-receiving apertures and corresponding electrical sockets. These sockets receive pins from the dual-in-line package of the integrated circuit for making electrical contact.

Numerous prior art patents disclose connectors and systems for making electrical contact. See, for example, U.S. Pat. Nos. 3,335,357, Damen, et al; 3,448,345, Koehler, Jr., et al; 3,717,841, Mancini; 4,004,196, Doucet; and 4,004,197, Hawkes, Jr.

A typical dual-in-line package or integrated circuit and connector or socket assembly is shown in Doucet, U.S. Pat. No. 4,004,196. Such a system is manufactured by Garry Manufacturing Company of New Brunswick, N.J., and sold as their Series 610.

A typical connector assembly as shown in Doucet is assembled by first assembling the socket and then inserting the contact into the plastic body or insulator frame. Typically the socket is spaced upwardly from the plastic body and has a contact-to-contact spacing of about 0.100 inch. In such situations the electrical integrity may be impaired by metal fragments, for example, from the component coming into contact with the socket or terminal on the face or top side of the assembly, possibly causing a circuit short or malfunction. Furthermore, pins from the component or integrated circuits are often bent when inserted into the socket because of a stepped lead-in entry hole which consists of two parts and a chamfer or due to misalignment of the parts.

It is an object of this invention to provide an improved electrical connection or termination system.

Another object of this invention is to provide an improved electrical termination system which minimizes circuit shorts or other malfunctions.

Yet another object of this invention is to provide a one-piece protected closed entry for the socket.

A further object of this invention is to provide an effective, readily manufactured and readily assembled dual-in-line integrated circuit socket assembly.

Another object of this invention is to provide a cost effective socket by reducing the raw material content of the socket terminal.

Still another object of this invention is to provide a cost effective product by reducing the surface of the socket terminal so as to minimize requirements.

Yet a further object of this invention is to provide a cost effective assembly by integrating the assembly of socket components and plastic frames on a single fully automated assembly line.

These and other objects of this invention will become apparent from the following description and appended claims.

SUMMARY OF THE INVENTION

There is provided by this invention an electrical connector system which includes an insulator block and a plurality of closely-spaced sockets or terminals for receiving connector pins from electronic components such as integrated circuits (IC). Each of the socket terminals includes a body section and a lead for electrical connection to other components such as circuit boards.

The insulator block has a plurality of closely-spaced pin-receiving apertures therein. At the pin-receiving end of the aperture, there is provided a conically-shaped inwardly tapering lead-in or chamfer which opens into a generally cylindrical socket-receiving portion of the block. Within the aperture, the tapering lead-in and the socket-receiving section define an inner abutment shoulder for use in positioning the socket within the aperture.

The socket terminal includes an elongated sleeve-like body section and an elongated terminal or lead pin. The body section has a hollow tube-like interior for receiving a connector pin from an electronic device and an outer surface with gripping means thereon for gripping the aperture-forming wall. The axial position of the socket terminal within the aperture relative to the conical lead is defined by the abutment of the edge of the socket body section with the inner abutment shoulder. The socket gripping means engages the aperture forming wall so as to secure the socket in place.

This structure as described in further detail hereinafter meets the objects of the invention.

DESCRIPTION OF THE PREFERRED EMBODIMENT

Figure 1:
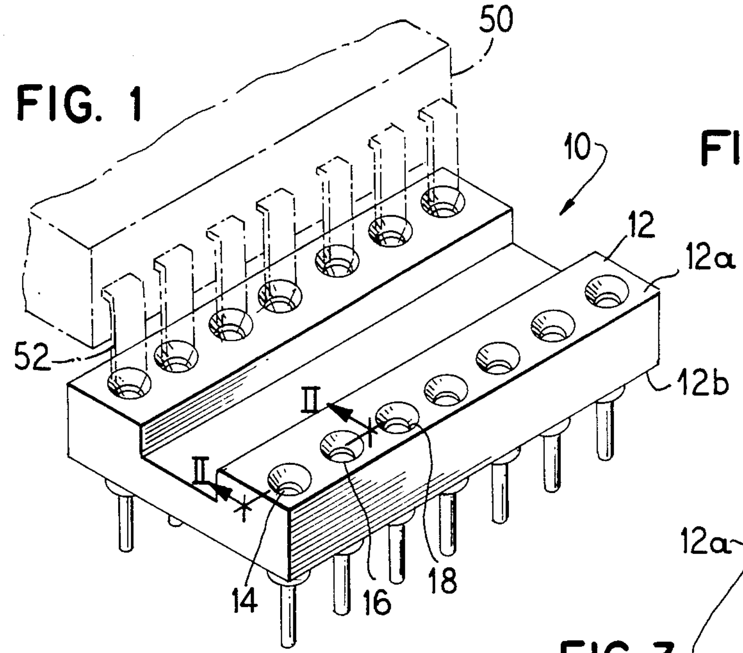
FIG. 1 is a perspective view showing a connector assembly having an insulator block with a plurality of apertures and socket terminals, along with an integrated circuit component whose pins are positioned to be inserted into sockets.

Referring now to the drawings, there is shown in FIG. 1 a dual-in-line socket assembly 10 generally, which includes an insulator block 12 having top and bottom faces **12*a* and 12*b* and a plurality of aligned and closely-spaced pin-and-socket-receiving apertures, such as 14, 16 and 18**, extending between the faces.

Each of the apertures includes a conically-shaped, inwardly tapering chamfer or countersink 20 in the top face of the insulator block, which acts as a lead-in or guide for pins associated with an electrical component such as IC entering the pin and socket-receiving aperture. The remaining portion of the aperture is a socket-receiving cylindrical bore 22 which extends between the lead-in to the lower face 12*b*.

As can be seen from the drawings, the lead-in 20 opens into the cylindrical bore 22 and at the junction, the lead-in 20 has a smaller diameter than the bore section 22, so as to form an internal abutment shoulder 24.

Each of the socket terminals, such as 26 generally, includes a hollow tubular pin-receiving body section 28 and a terminal or lead end 30. Typically each of the socket terminals are machined from brass. The exterior surface of the socket body section includes a tapered lead-in or upper end 32 and a pair of grooves 34 and 36 which are shaped to form a barb or "fish hook" 38 for grasping the insulator block.

The outer diameter of the socket body 28 is slightly larger than the inner diameter of the socket-receiving aperture 22 so that when the socket is inserted into the aperture, an interference or press fit results for holding the socket in place. The travel or positioning of the socket 26 is limited and defined by the engagement of the upper edge of the socket terminal 26 with the insulator block abutment shoulder 24.

It will be appreciated that since the socket 26 does not extend to or above the top face 12*a* of the insulator block, it is shorter in length than other socket terminals, requires less material to make, is less expensive to manufacture and requires less plating to assure excellent electric contact.

Figure 5:
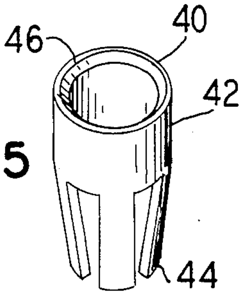
FIG. 5 is a perspective view showing a socket contact for positioning within the socket terminal and for electrically contacting the component pin.
Figure 3:
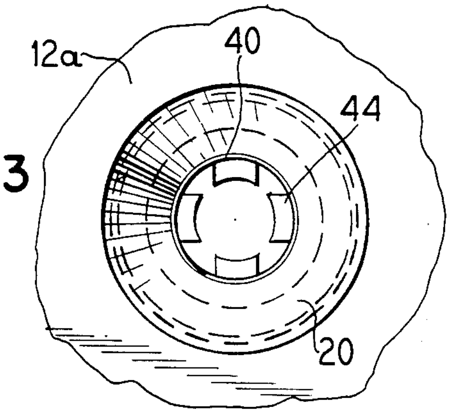
FIG. 3 is a plan view of a pin-receiving socket showing the positioning of the socket terminal in the insulator block.
Figure 2:
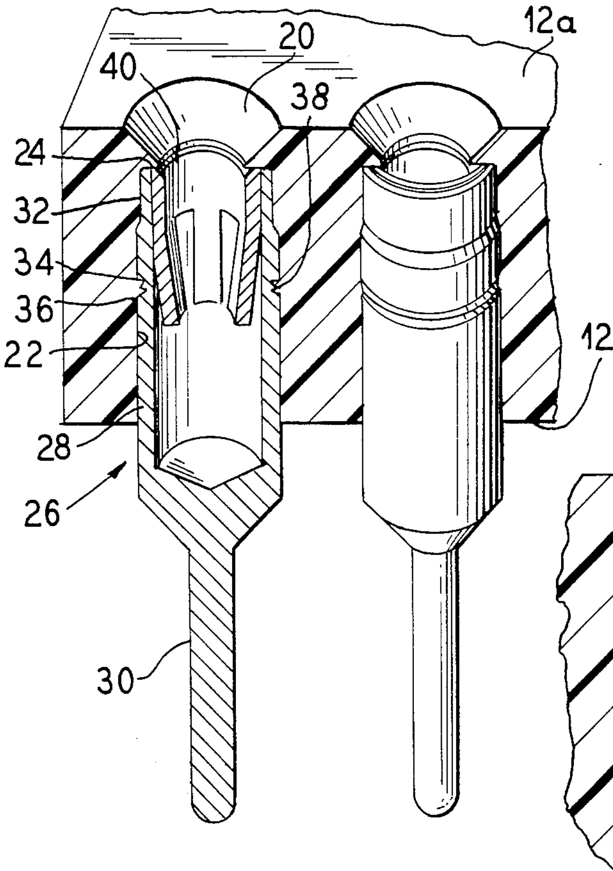
FIG. 2 is a sectional view taken along 2—2 of FIG. 1 and showing the insulator block portion of the connector assembly in section with the left-hand socket terminal shown in section and the right-hand socket terminal shown in full.

An electric contact element 40 is positioned inside each of the socket terminals for making physical and electrical contact with the electrical component pins. The contact as seen in FIG. 5 is a sleeve-like element which includes a ring-like upper section 42 and four depending resilient inwardly biased contact tabs or fingers such as 44. The outside diameter of the ring-like portion of the sleeve 42 is slightly larger than the inside diameter of the socket terminal so as to require that the contact be press fitted into the inside of the socket terminal 26. When positioned in the socket terminal, the top edge of the contact is flush with the socket top edge. It will be noted that the top edge of the contact has a slight taper or lead-in 46.

Figure 4:
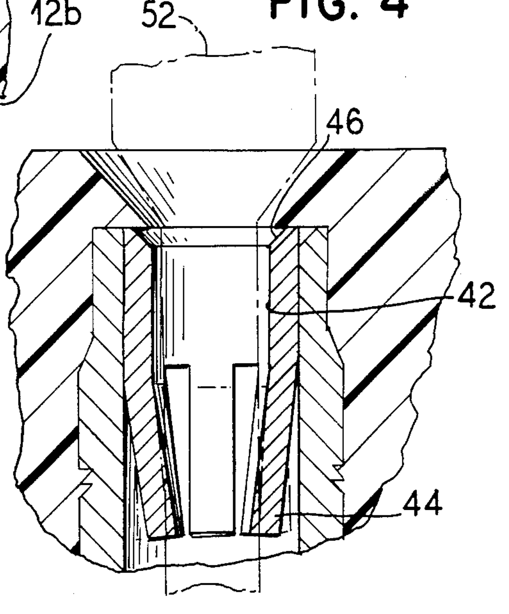
FIG. 4 is a greatly enlarged sectional view showing the upper portion of a socket terminal and a pin extending therein.

Referring to FIG. 4, it is seen that the inside diameter of the socket terminal approximates the inside diameter of the lead-in 20 and is generally axially aligned therewith. This alignment aids in guiding the electrical component pins into the socket terminal.

Referring now to FIG. 1, an electrical component 50 is shown in dashed lines and includes a plurality of pins such as 52. In order to connect the electronic component 50 to the socket assembly, the pins, such as 52, are inserted through the lead-ins, such as 20, into the socket 26. The press fit socket and fish hook grip 38 prevent downward axial movement of the socket. Furthermore, as seen in FIG. 4, the pin 52 enters the lead-in, extends into the sleeve or ring portion 42 of the sleeve and then engages and contacts one or more of the inwardly biased resilient tabs 44.

Among the advantages to this system is a reduction in the amount of material needed to make each socket, a reduction in the surface area required to be plated for electrical contact, accurate positioning of the connector in each of the apertures due to the positioning of the abutment shoulder, and a minimization of short circuiting or interconnection between the socket element by positioning all of the metallic contacts below the surface of the insulator block.

It will be appreciated that numerous changes and modifications can be made to the embodiment disclosed herein without departing from the spirit and scope of this invention.

What is claimed and desired to be secured by Letters Patent of the United States is:

1. An electrical connector which comprises an insulator block having planar top and bottom faces with closely spaced bores therethrough connecting said faces, each bore having a conical lead-in mouth at the top face of the block and an elongated cylindrical portion of greater diameter than the inner end of the conical mouth together with a radial abutment shoulder between the top end of the cylindrical bore and the bottom end of the tapered mouth, a rigid machined tubular socket member in each bore with a top edge against the shoulder of the bore and having an outer diameter not less than the bore diameter for press fit engagement therewith and an inner diameter greater than the inner end of the tapered mouth thereby exposing the shoulder of the bore of the insulator block, said tubular socket member having a closed bottom end with a reduced diameter rigid pin extending beyond the bottom of the insulator block, a metal tubular contact element pressed into the upper end of the socket bore of each socket member with a top edge flush with the top edge of the socket member and bottomed against the exposed abutment shoulder, the combined thickness of the socket member and contact element being greater than the width of the radial abutment shoulder, the top end of said contact element being conically tapered to eliminate any internal abutment shoulder under the tapered mouth to cooperate with the tapered mouth for guiding an electrical component therein, the bottom end of said contact element having inwardly biased spring fingers for securing the electrical component in the socket member, and said reduced diameter pin end portion of the socket member extending beyond the bottom face of the insulator block in close relation with adjacent pins whereby the top face of the insulator block is free from projections, the tapered mouth and the tapered end of the tubular contact element in the tubular socket guide an electrical component into an engagement with the fingers and the projecting pins of the sockets provide closely spaced terminals.

* * * * *